United States Patent
Losee et al.

(10) Patent No.: US 10,403,623 B2
(45) Date of Patent: Sep. 3, 2019

(54) GATE NETWORKS HAVING POSITIVE TEMPERATURE COEFFICIENTS OF RESISTANCE (PTC) FOR SEMICONDUCTOR POWER CONVERSION DEVICES

(71) Applicant: General Electric Company, Schenectady, NY (US)

(72) Inventors: Peter Almern Losee, Clifton Park, NY (US); Alexander Viktorovich Bolotnikov, Niskayuna, NY (US); Fabio Carastro, Munich (DE); Alvaro Jorge Mari Curbelo, Oberschleissheim (DE)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 0 days.

(21) Appl. No.: 15/643,146

(22) Filed: Jul. 6, 2017

(65) Prior Publication Data

US 2019/0013311 A1    Jan. 10, 2019

(51) Int. Cl.
*H01L 27/06* (2006.01)
*H01L 23/522* (2006.01)
(Continued)

(52) U.S. Cl.
CPC ...... *H01L 27/0629* (2013.01); *H01L 21/8234* (2013.01); *H01L 21/823437* (2013.01);
(Continued)

(58) Field of Classification Search
CPC ............. H01L 23/5228; H01L 23/5286; H01L 27/0629; H01L 29/42372; H01L 29/4238
(Continued)

(56) References Cited

U.S. PATENT DOCUMENTS 4,920,388 A    4/1990   Blanchard et al.
5,366,932 A    11/1994  Temple
(Continued)

OTHER PUBLICATIONS

Wang et al., "A double-end sourced multi-chip improved wire-bonded SiC MOSFET power module design", 2016 IEEE Applied Power Electronics Conference and Exposition (APEC), pp. 709-714, Mar. 20-24, 2016, Long Beach, CA.
(Continued)

*Primary Examiner* — Matthew E Warren
(74) *Attorney, Agent, or Firm* — Fletcher Yoder, P.C.

(57) ABSTRACT

A gate network of a silicon-carbide (SiC) power conversion device includes a plurality of gate electrodes of SiC metal-oxide-semiconductor-based (MOS-based) transistor device cells disposed in an active area of the SiC power conversion device, and a gate pad disposed in a gate pad and bus area of the SiC power conversion device. The gate network also includes a gate bus disposed in the gate pad and bus area of the SiC power conversion device, wherein the gate bus extends between and electrically connects the gate pad to at least a portion of the plurality of gate electrodes in the active area of the SiC power conversion device. At least a portion of the gate pad, the gate bus, the plurality of gate electrodes, or a combination thereof, of the gate network have a positive temperature coefficient of resistance greater than approximately 2000 parts-per-million per degree Celsius (ppm/° C.).

15 Claims, 14 Drawing Sheets

(51) Int. Cl.
*H01L 23/528* (2006.01)
*H01L 29/423* (2006.01)
*H01L 29/16* (2006.01)
*H01L 21/8234* (2006.01)
*H01L 29/78* (2006.01)
*H01L 27/07* (2006.01)

(52) U.S. Cl.
CPC .. *H01L 21/823475* (2013.01); *H01L 23/5228* (2013.01); *H01L 23/5286* (2013.01); *H01L 29/1608* (2013.01); *H01L 29/4238* (2013.01); *H01L 29/42316* (2013.01); *H01L 29/42372* (2013.01); *H01L 29/7802* (2013.01); *H01L 27/0738* (2013.01)

(58) Field of Classification Search
USPC .................................. 257/77, 203, 207, 208
See application file for complete search history.

(56) References Cited

U.S. PATENT DOCUMENTS

| | | |
|---|---|---|
| 5,592,006 A | 1/1997 | Merrill |
| 8,314,462 B2 | 11/2012 | Hull et al. |
| 8,324,686 B2 | 12/2012 | Willmeroth et al. |
| 8,614,480 B2 | 12/2013 | Wang et al. |
| 9,041,120 B2 | 5/2015 | Voss et al. |
| 2006/0202304 A1 | 9/2006 | Orr |
| 2006/0237750 A1 | 10/2006 | Oakes et al. |
| 2008/0251793 A1 | 10/2008 | Mazzola et al. |
| 2011/0182324 A1* | 7/2011 | Stoisiek ................. G01K 7/16 374/185 |
| 2015/0280611 A1 | 10/2015 | Kusumoto et al. |
| 2015/0364468 A1* | 12/2015 | Kiep ................. H01L 29/7395 257/139 |
| 2018/0281390 A1* | 10/2018 | Fujii ................. B41J 2/04541 |

OTHER PUBLICATIONS

Ji Hu et al., "Robustness and Balancing of Parallel-Connected Power Devices: SiC Versus CoolMOS", IEEE Transactions on Industrial Electronics, vol. 63, Issue: 4, pp. 2092-2102, Apr. 2016.
International Search Report for Application No. PCT/US2018/040663 dated Oct. 1, 2019.

* cited by examiner a

GATE NETWORKS HAVING POSITIVE TEMPERATURE COEFFICIENTS OF RESISTANCE (PTC) FOR SEMICONDUCTOR POWER CONVERSION DEVICES

BACKGROUND

The subject matter disclosed herein relates generally to semiconductor power conversion devices and, more specifically, to silicon carbide (SiC) power conversion devices.

Power conversion systems are widely used throughout modern electrical systems to convert electrical power from one form to another for consumption by a load. Many power electronics systems utilize various semiconductor devices and components, such as thyristors, diodes, and various types of transistors (e.g., metal-oxide-semiconductor field-effect transistor (MOSFETs), insulated gate bipolar transistors (IGBTs), and other suitable transistors), in this power conversion process. Larger power conversion system can include numerous power conversion devices (e.g., arranged into power modules) that cooperate to convert electrical power.

Gate resistance can dramatically affect the performance of SiC power conversion devices, such as SiC MOSFET and SiC IGBT power conversion devices. In general, such devices are designed to have low gate resistance to enable fast switching time and low switching losses. Additionally, when the device is switched off, the peak drain-source voltage of a SiC power conversion device can overshoot and temporarily exceed a rated or maximum voltage ($V_{max}$) of the device, which can stress the power conversion device, as well as other components of a power module. While external resistors (e.g., standalone, surface-mounted or through-chip resistors) can be used to modify an external gate resistance of a power conversion device to reduce voltage overshoot and avoid or dampen oscillations, such external resistors generally add additional cost and complexity to the power modules, increase device switching losses, and consume precious limited space within the device packaging.

Additionally, unlike their Si counterparts, SiC power conversion devices generally exhibit an increase in transconductance as the temperature at the surface of the semiconductor die, also referred to as junction temperature ($T_j$), rises during device operation. This increased transconductance results in relatively faster switching transients (e.g. faster turn-on times) and more substantial changes in voltage and current per unit time when a SiC power conversion device is switching. As a result, a power conversion device that is operating at higher temperature than other power conversion devices tends to handle and conduct more current during switching transients, which can stress the power conversion devices as the module becomes dynamically imbalanced.

BRIEF DESCRIPTION

In an embodiment, a silicon-carbide (SiC) power conversion device includes a gate network with a plurality of gate electrodes of SiC metal-oxide-semiconductor-based (MOS-based) transistor device cells disposed in an active area of the SiC power conversion device, and a gate pad disposed in a gate pad and bus area of the SiC power conversion device. The gate network also includes a gate bus disposed in the gate pad and bus area of the SiC power conversion device, wherein the gate bus extends between and electrically connects the gate pad to at least a portion of the plurality of gate electrodes in the active area of the SiC power conversion device. At least a portion of the gate pad, the gate bus, the plurality of gate electrodes, or a combination thereof, of the gate network have a positive temperature coefficient of resistance greater than approximately 2000 parts-per-million per degree Celsius (ppm/° C.).

In another embodiment, a method includes forming a gate network at a surface of a semiconductor layer of a silicon carbide (SiC) power conversion device, wherein the gate network has a plurality of gate electrodes of a plurality of SiC metal-oxide-semiconductor-based (MOS-based) transistor device cells disposed in an active area of the SiC power conversion device; and a gate pad disposed in a gate pad and bus area of the SiC power conversion device that is electrically connected to each of the plurality of gate electrodes. At least a portion of the gate network has a positive temperature coefficient of resistance greater than approximately 2000 parts-per-million per degree Celsius (ppm/° C.).

In another embodiment, a silicon carbide (SiC) power conversion device, includes an active area having a plurality gate electrodes of a respective plurality of SiC metal-oxide-semiconductor-based (MOS-based) transistor device cells disposed in different portions of the active area. The device includes a gate pad and bus area, having a gate pad including a gate metal contact region disposed adjacent to an integrated resistor network; and a first gate bus extending between the gate pad and a first portion of the plurality of gate electrodes in a first portion of the active area of the device. The first portion of the plurality of gate electrodes is electrically connected to the gate metal contact region via a first portion of the integrated resistor network and the first gate bus, and a second portion of the plurality of gate electrodes in a second portion of the active area of the device is electrically connected to the gate metal contact region via a second portion of the integrated resistor network. A resistance value of the first portion of the integrated resistor network is substantially different from a resistance value of the second portion of the integrated resistor network. Additionally, at least a portion of the plurality of gate electrodes, the gate pad, the first gate bus, or a combination thereof, has a positive temperature coefficient of resistance that is greater than approximately 2000 parts-per-million per degree Celsius (ppm/° C.).

BRIEF DESCRIPTION OF THE DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
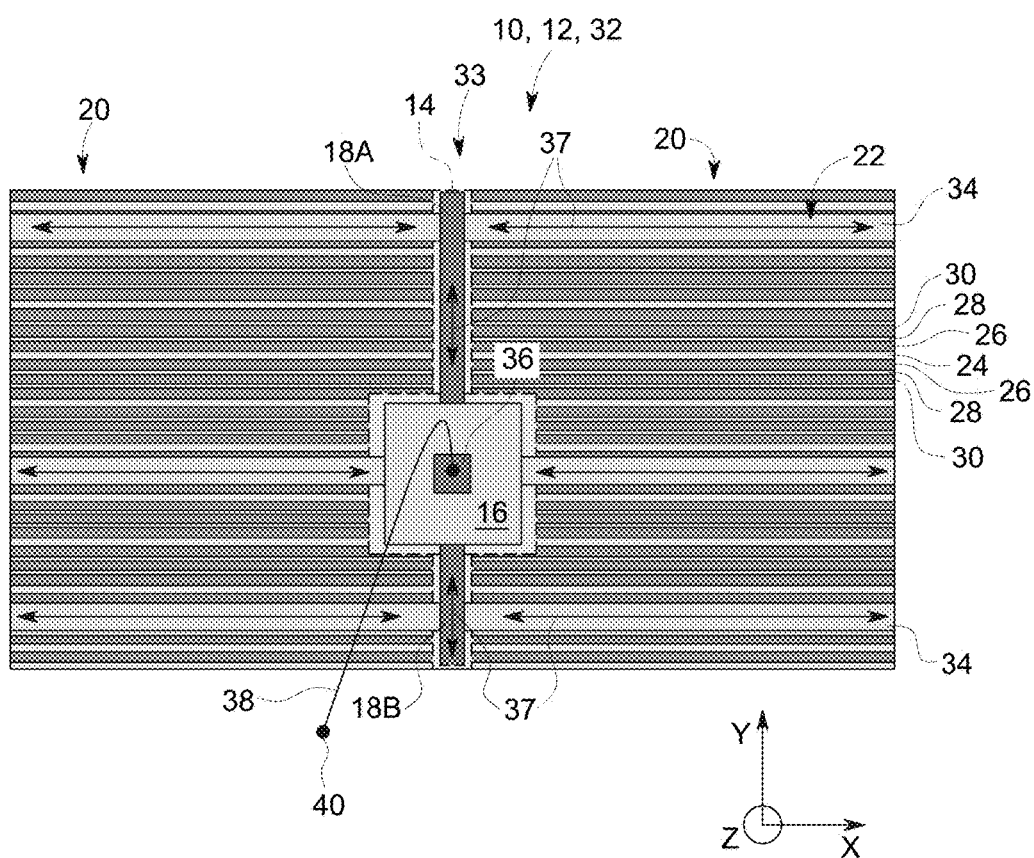
FIG. 1 is a top-down view of a portion of a power conversion device including an active area having a number of MOSFET device cells, and including a gate network having a gate pad electrically connected to gate electrodes of the device cells in the active area, wherein at least a portion of the gate network has a positive temperature coefficient of resistance (PTC), in accordance with embodiments of the present approach.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also when introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. If ranges are disclosed, the endpoints of all ranges directed to the same component or property are inclusive and independently combinable. The modifier "approximately" used in connection with a quantity is inclusive of the stated value and has the meaning dictated by the context (e.g., includes the degree of process variations or errors associated with measurement of the particular quantity).

As used herein, the term "layer" refers to a material disposed on at least a portion of an underlying surface in a continuous or discontinuous manner. Further, the term "layer" does not necessarily mean a uniform thickness of the disposed material, and the disposed material may have a uniform or a variable thickness unless otherwise specified. Furthermore, the term "a layer" as used herein refers to a single layer or a plurality of layers, unless the context clearly dictates otherwise. Further, as used herein, the phrase "disposed on," refers to layers disposed directly in contact with each other or indirectly by having intervening layers there between, unless otherwise specifically indicated. The terms "adjacent," "directly on," "directly over," "directly under," as used herein refers to two layers or features that are disposed contiguously and are in direct contact with each other. In contrast, the terms "on," "above," "below," describe the relative position of the layers/regions to each other and does not necessarily require that two layers or features be disposed contiguously or be in direct contact with each other. As used herein, the terms "top" or "upper" refer to the particular feature that is relatively the farthest from the substrate layer.

As used herein, a "gate network" refers to components of a power conversion device that are part of the electrical pathway between the gate pad metal and plurality of active device cells. As such, a gate network may include, for example, a gate pad (potentially having an integrated resistor network, as discussed below), gate buses, and gate electrodes of a power conversion device. The term "positive temperature coefficient of resistance (PTC)," also referred to herein as positive temperature coefficient of resistance (positive TCR), is used herein to describe device components and materials having a resistivity that increases with increasing temperature, and that decreases with decreasing temperature, over a particular temperature range. A temperate coefficient of resistance of a material has units in parts per million per degree Celsius (ppm/° C.) and is calculated according to the following equation:

$$TCR = \left( \frac{(R(T_{high}) - R(T_{low}))/R(T_{low})}{T_{high} - T_{low}} \right) \times 10^6 \qquad \text{Eq. 1}$$

wherein R(T) is the resistance of the material at a particular temperature (T), while $T_{high}$ and $T_{low}$ represent the range of temperatures over which the material changes resistance. As used herein, "$R_g$" represents and refers to the total equivalent series resistance of the transistor gate of a power conversion device. It should be understood that, in certain embodiments, there may be also be an external resistance component (i.e., $R_{g\text{-}external}$) that is separate distinct from $R_g$ and that may have a value of zero or more.

As set forth above, SiC power conversion devices (e.g., SiC MOSFETs and SiC IGBTs) are generally designed to have low gate resistance to enable fast switching and low switching losses. However, it is presently recognized that, for SiC power conversion devices, voltage overshoots can become more pronounced with decreasing gate resistance, and this can undesirably increase switching losses, induce oscillations and overshoots that can cause failures to the semiconductor module or other system elements. Additionally, as mentioned above, unlike Si power conversion devices, SiC power conversion devices generally exhibit increased transconductance with increased junction temperature ($T_j$), which produces relatively faster switching transients (e.g. faster turn-on times) and more substantial changes in voltage and current per unit time when a SiC power conversion device is switching at relatively higher temperatures.

With the foregoing in mind, present embodiments are directed toward semiconductor power conversion devices (e.g., SiC MOSFETs and SiC IGBTs) that include a gate network having a positive temperature coefficient of resistance (PTC). The disclosed gate network enables a power conversion device to have a variable total equivalent series gate resistance ($R_g$) over a range of typical operating temperatures (e.g., between about 25° C. and about 150° C.) of the power conversion device. As set forth in detail below, in certain embodiments, the disclosed gate network is generally in thermal proximity to nearby device cells and can vary in resistivity in response to changes in the junction temperature of these cells. As discussed below, embodiments of the gate network are designed to have suitable resistivity to ensure that the device cell peak voltage remains below a maximum voltage rating ($V_{max}$), avoids ringing, interchip oscillations, and reduces switching losses of the device cells, over the range of typical operating temperatures. Further, the disclosed gate network does not require extra processing steps to implement relative to a gate network that does not have a positive temperature coefficient of resistance.

With the foregoing in mind, FIG. 1 illustrates a top-down view of a portion of an embodiment of a power conversion device 12 (e.g., a SiC power conversion device having a SiC epitaxial semiconductor layer 10). The device 12 includes a gate pad and bus area 14 (indicated by the dashed outline) having a gate pad 16 and a gate buses 18 (e.g., gate bus 18A and 18B). The illustrated device 12 further includes an active area 20, which is the area outside of the dashed outline of the gate pad and bus area 14. The illustrated active area 20 includes a number of device cells 22 (e.g., striped MOSFET device cells 22) disposed on opposite sides of the gate pad and bus area 14. It should be appreciated that, while the present technique is discussed herein in the context of the illustrated striped MOSFET device cells 22, the present techniques may be applicable to other types of semiconductor device structures, such as diodes, thyristors, transistors (e.g., insulated gate bipolar transistor (IGBT), junction field-effect transistor (JFET), metal-semiconductor field-effect transistor (MESFET), etc.), or any other suitable device utilizing a gate electrode using any type of active cell geometry (e.g., square, stripe, hexagonal, etc.). Additionally, the present approach may be applicable to other types of material systems (e.g., silicon (Si), germanium (Ge), aluminum nitride (AlN), gallium nitride (GaN), gallium arsenide (GaAs), diamond (C), or any other suitable wide band-gap semiconductor). Those skilled in the art will appreciate that, for illustrative purposes, FIG. 1 omits certain features of the device 12 (e.g., certain gate electrodes, gate dielectrics, interlayer dielectrics, source metal, terminations, packaging) included in actual implementations of the presently disclosed technique, some of which are discussed in greater detail below.

The illustrated striped MOSFET device cells 22 of FIG. 1 include body/source contact regions 24 (e.g., common contact), source regions 26, channel regions 28, and junction field-effect transistor (JFET) regions 30 that disposed adjacent to the surface 32 of semiconductor layer 10. Further, while only a portion of the MOSFET cells 22 in FIG. 1 are illustrated as including gate electrodes 34 to allow a better view of the semiconductor layer 10, in an actual implementation of the power conversion device 12, all of the device cells 22 would generally include a respective gate electrode 34 disposed at least partially above substantially all of the source regions 26, channel regions 28, and junction field-effect transistor (JFET) regions 30 at the surface 32 of the semiconductor layer 10. It may be noted that cross-sectional views of an example power conversion device 12 are discussed below, with respect to FIGS. 8A and 8B, and provide additional details regarding the structure of these device cells 22.

As illustrated in FIG. 1, a gate network 33 of the illustrated power conversion device 12 includes the gate pad 16, the gate buses 18, and the gate electrodes 34, wherein at least a portion of the gate network 33 has a PTC greater than a particular amount (e.g., greater than 2000 ppm/° C.) over a particular temperature range (e.g., between 25° C. and 150° C.). The illustrated gate pad 16 includes a gate metal contact region 36. As discussed below with respect to FIG. 15, in other embodiments, the gate pad 16 may also include an integrated resistor network disposed adjacent to the gate metal contact region 36. A gate pad metal (not illustrated in FIG. 1) is disposed directly over the gate metal contact region 36 and is wire bonded (e.g., via wire bond 38) to an external gate connection 40 via or through the gate pad 16 and gate buses 18, the external gate connection 40 provides suitable gate biases to operate the gate electrodes 34 of power conversion device 12. Therefore, when a suitable gate voltage pulse is applied to the gate metal contact region 36 by the external gate connection 40, transient current generally flows through gate network 33 (e.g., through the gate pad 16, the gate bus 18, and along the gate electrodes 34 of the device cells 22), as indicated by the arrows 37.

As mentioned, at least a portion of the illustrated gate network 33 has a positive temperature coefficient of resistance (PTC). More specifically, for the illustrated embodiment, both the gate pad 16 and gate electrodes 34 are made of a PTC material and demonstrate PTC properties. In other embodiments, a power conversion devices 12 may include a gate network 33, wherein only one of the gate pad 16, the gate buses 18, or the gate electrodes 34, are made of a PTC material and/or demonstrate PTC properties. It may be appreciated that, in certain embodiments, while other portions of the gate network 33 (e.g., gate metal contact region 36, buses 18) may generally be made of the same material as the remainder of the gate network 33, the PTC properties of these regions can be largely suppressed when metal (e.g., gate pad metal, gate bus metal) is directly deposited over these regions. In other embodiments, the buses 18 may not include such a metal layer and, accordingly, may have a PTC in addition to (or in alternative to) the gate pad 16 and the gate electrodes 34.

Figure 2:
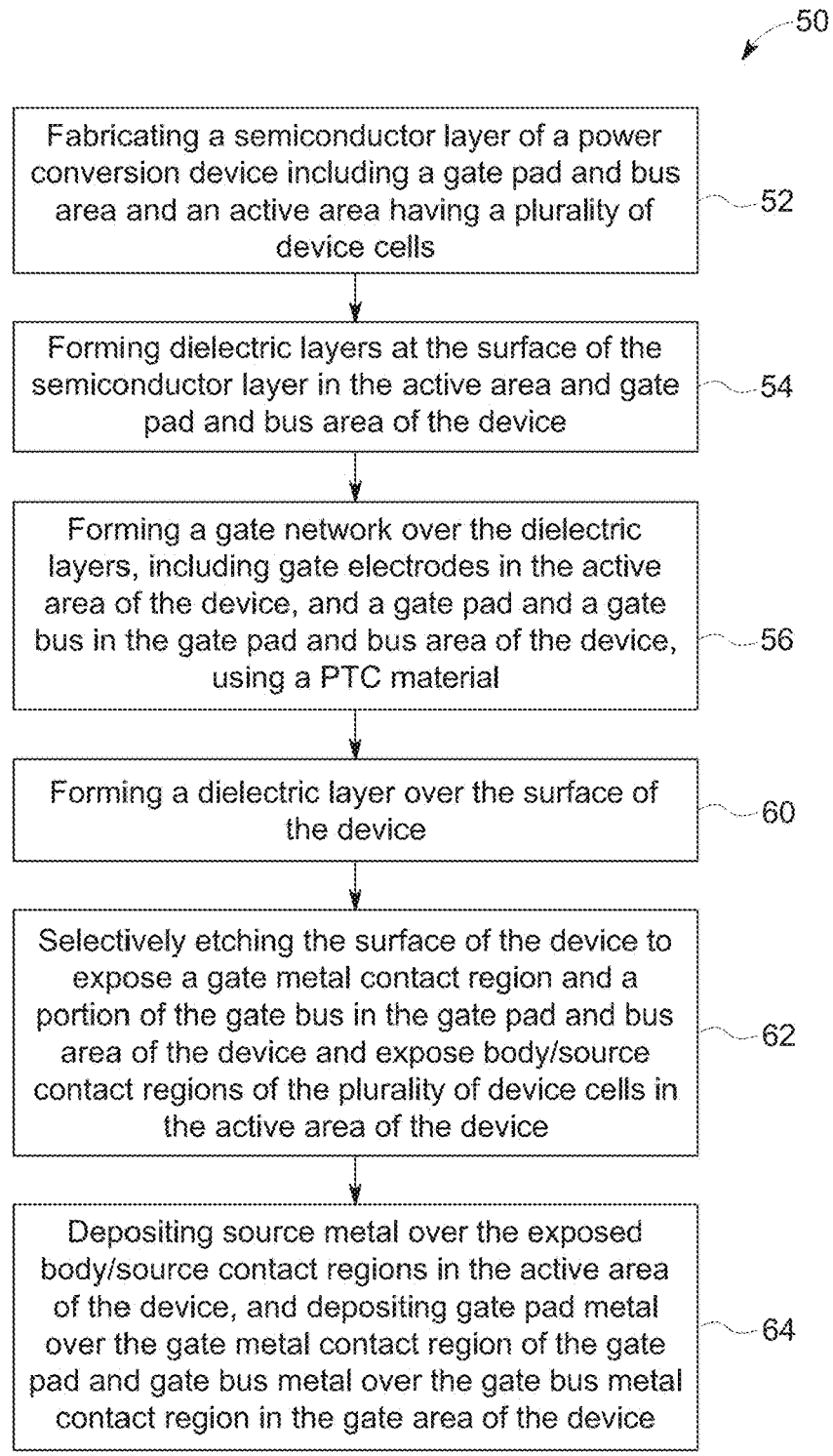
FIG. 2 is a flow diagram of a portion of a process for fabricating the power conversion device of FIG. 1, in accordance with embodiments of the present technique.
Figure 3:
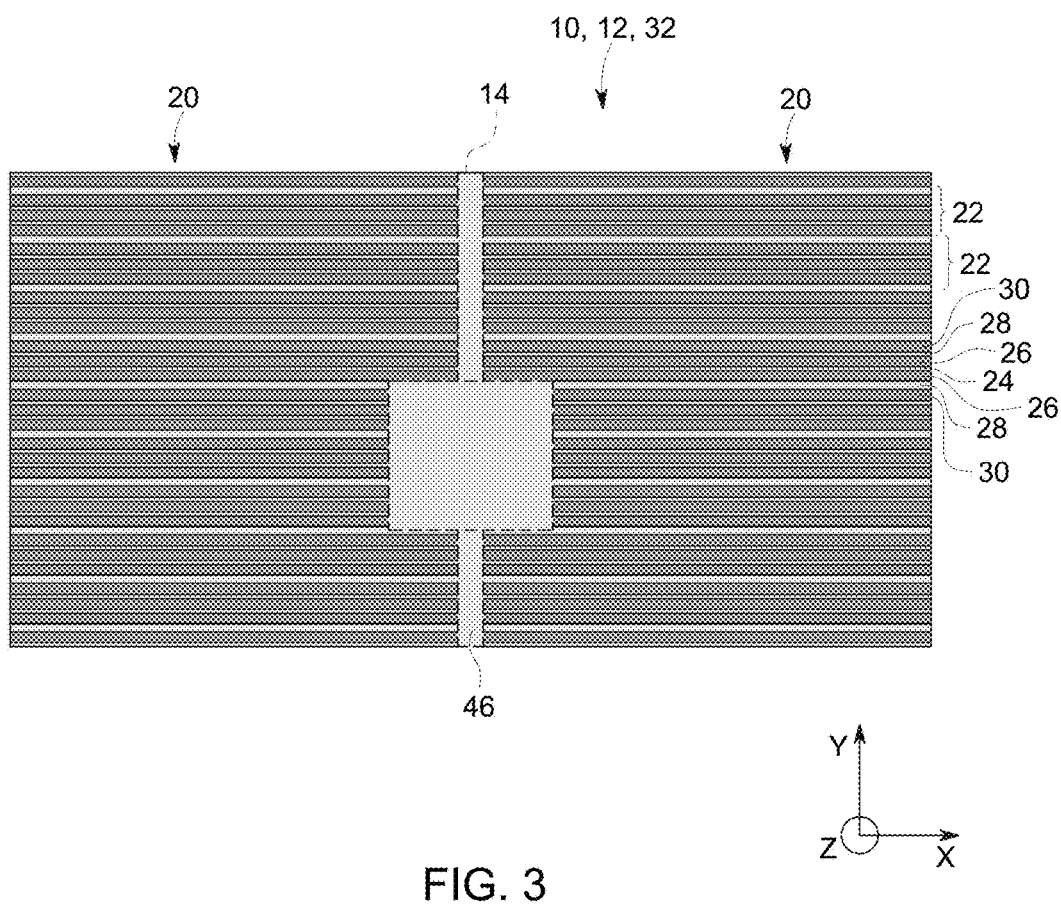
FIG. 3 is a top-down view of the surface of an example power conversion device at the beginning of the fabrication process of FIG. 2, in accordance with embodiments of the present approach.

With the foregoing in mind, FIG. 2 is a flow diagram illustrating an embodiment of a portion or subset of a process 50 for fabricating a power conversion device 12 with a gate network 33 having a PTC, as illustrated in FIG. 1, in accordance with embodiments of the present technique. Further, FIGS. 3-7 are referred to throughout the description of the illustrated process 50, to provide top-down, surface views of an example semiconductor power conversion device 12 at different stages of fabrication. The illustrated process 50 begins with fabricating (block 52) a semiconductor layer 10 of the semiconductor power conversion device 12. For example, FIG. 3 illustrates a surface 32 of a semiconductor layer 10 (e.g., a SiC epitaxial layer) of an embodiment of a power conversion device 12. The active area 20 of the illustrated device 10 includes body/source contact regions 24, source regions 26, channel regions 28, and JFET regions 30 of a plurality of partially formed device cells 22, all disposed adjacent to the surface 32 of a semiconductor layer 10. As may be appreciated, these regions of the device cells 22 are generally formed and defined via successive masking and doping of the semiconductor layer 10. Furthermore, it may be noted that the JFET regions 30 and source regions 26 have a first conductivity-type (e.g., n-type or p-type), and the body/source contact regions 24 and the well/channel regions 28 have a second conductivity-type (e.g., n-type or p-type) that is opposite the first conductivity-type. Additionally, like the regions 24 and 28, the gate pad and bus area 14 includes an implanted region 46 of the second conductivity-type, as illustrated in FIG. 3.

Figure 4:
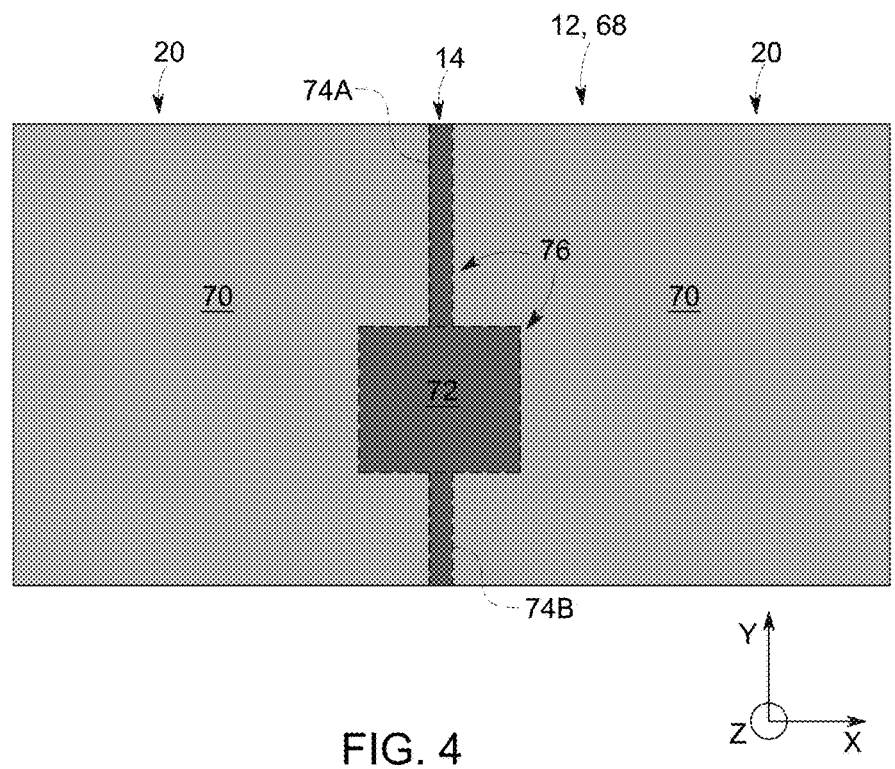
FIG. 4 is a top-down view of the surface of the power conversion device illustrated in FIG. 3, after deposition of dielectric layers over portions of the active area and gate pad and bus area of the device, in accordance with embodiments of the present approach.

The process 50 illustrated in FIG. 2 continues with forming (block 54) dielectric layers at (e.g., on or over) the surface 32 of the semiconductor layer 10. For example, FIG. 4 illustrates a top surface 68 of the power conversion device 12 of FIG. 3, in which the active area 20 is substantially covered with a gate dielectric layer 70. Additionally, the gate pad and bus area 14 of the device 12 includes a gate pad area 72 and a gate bus areas 74 (e.g., gate bus areas 74A and 74B) having a field oxide layer 76 that is substantially thicker (e.g., 5×-20× thicker along the Z-axis) than the gate dielectric layer 70. For example, the gate dielectric layer 70 and the field oxide layer 76 may be formed during separate oxide growth or deposition steps.

Figure 5:
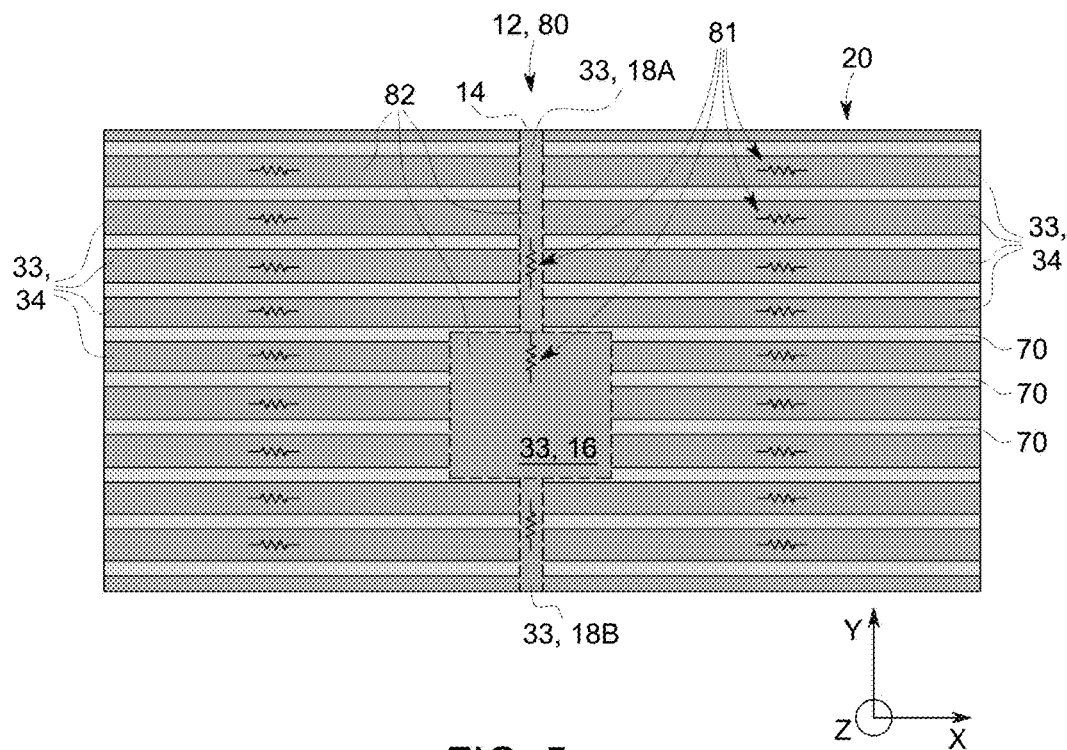
FIG. 5 is a top-down view of the surface of the power conversion device illustrated in FIG. 4, after forming a gate network having a PTC, in accordance with embodiments of the present approach.

Returning to FIG. 2, the illustrated process 50 continues with forming (block 56) the gate network 33 of the power conversion device 12 using a PTC material. For example, this may include forming the gate electrodes 34 in the active area 20 of the power conversion device, and forming a gate pad 16 and a gate buses 18 in the gate pad and bus area 14 of the device 12. In certain embodiment, some or all of the gate network 33 (e.g., some or all of the gate pad 16, gate buses 18, and gate electrodes 34) may be formed from the same PTC material. For example, FIG. 5 illustrates a surface 80 of the power conversion device 12 after forming the gate network 33, including gate electrodes 34, gate pad 16, and gate buses 18 (e.g., gate buses 18A and 18B). More specifically, the gate electrodes 34 are deposited directly on the gate dielectric layer 70 in the active area 20 of the device 12, and the gate pad 16 and gate buses 18 (e.g., gate bus 18A and 18B) are deposited directly over the field oxide layer 76 (as illustrated in FIG. 4) in portions of the gate pad and bus area 14 of the device 12.

For the embodiment illustrated in FIG. 5, the gate network 33, including the gate electrodes 34, the gate pad 16, and the gate buses 18, are made of at least one low-impedance gate material 82 having a positive temperature coefficient of resistance (PTC) that is greater than approximately 2000 ppm/° C. For example, the gate material 82 may be highly doped polysilicon disposed directly below a metal silicide (e.g., molybdenum silicide ($MoSi_2$), tantalum silicide ($TaSi_2$), tungsten silicide ($WSi_2$), cobalt silicide ($CoSi_2$), nickel silicide ($NiSi_2$), titanium silicide ($TiSi_2$)) layer. That is, in certain embodiments, the gate network 33 (e.g., gate electrodes 34, the gate pad 16, and the gate buses 18) are all made from the same gate material 82, which includes a polysilicon layer (e.g., n-doped polySi) disposed below (e.g., under or directly below) a metal silicide layer (e.g., $TaSi_2$). In certain embodiments, only a portion of the gate pad 16 may have a PTC greater than approximately 2000 ppm/° C., and the gate buses 18 and/or the gate electrodes 34 may have a substantially lower PTC (e.g., less than 2000 ppm/° C., less than 1500 ppm/° C., less than 1000 ppm/° C.) or may not demonstrate PTC properties. In certain embodiments, the gate material 82 that forms the gate pad 16, the gate buses 18, and/or the gate electrodes 34 having the aforementioned PTC may also have a sheet resistance of between approximately 2 ohms per square (ohm/square) and approximately 50 ohm/square (e.g., between approximately 3 ohms/square and approximately 6 ohms/square) at 25° C. Further, in certain embodiments, the gate pad 16 and the gate electrodes 34 may have substantially the same sheet resistance.

In certain embodiments, the gate material 82 first may be deposited over a substantial portion of the surface 68 of the device 12 illustrated in FIG. 4, and then may be selectively etched to form the gate network 33 on the surface 80 of the device, as illustrated in FIG. 5. In FIG. 5, the PTC of the gate network 33 (e.g., the PTC of the gate pad 16, the gate buses 18, the gate electrodes 34) is schematically represented by resistor symbols 81. For embodiments in which the gate electrodes 34 demonstrate PTC properties, since the gate network 33 is positioned above a substantial portion of the surface area of the semiconductor layer, the gate network 33 is nearby (e.g., proximate to, in thermal proximity with) substantially all device cells 22. Accordingly, for such embodiments, individual portions of the disclosed gate network 33 (e.g., individual gate electrodes 34) can independently vary in resistivity in response to changes in the junction temperatures of nearby device cells 22. Additionally, as set forth below with respect to FIG. 15, in certain embodiments, the gate pad 16 may additionally include an integrated resistor network that is fabricated from the gate material 82 along with the remainder of the gate network 33.

The gate network 33 is generally fabricated using a mask/lithography/implantation/etching process. In certain embodiments, this may involve a two-step deposition process in which highly doped polySi (e.g., n+ or p+ doped) is first be deposited onto the surface 80 (e.g., to a thickness of between approximately 2500 angstrom (Å) and approximately 4000 Å), followed by deposition of a silicide layer (e.g., to a thickness of between approximately 1500 Å and approximately 4000 Å), to form silicide polySi layer, which is subsequently patterned and etched to form the gate network 33 (e.g., gate pad 16, gate buses 18, and gate electrodes 34) of the device 12. As mentioned, the disclosed gate network 33 ensures that that the device peak voltage remains below a maximum voltage ($V_{max}$) and reduces switching losses of the device over a range of typical junction temperatures (e.g. between 20° C. and 150° C. or 175° C.), without requiring additional fabrication steps and without the use of external chip resistors.

Figure 6:
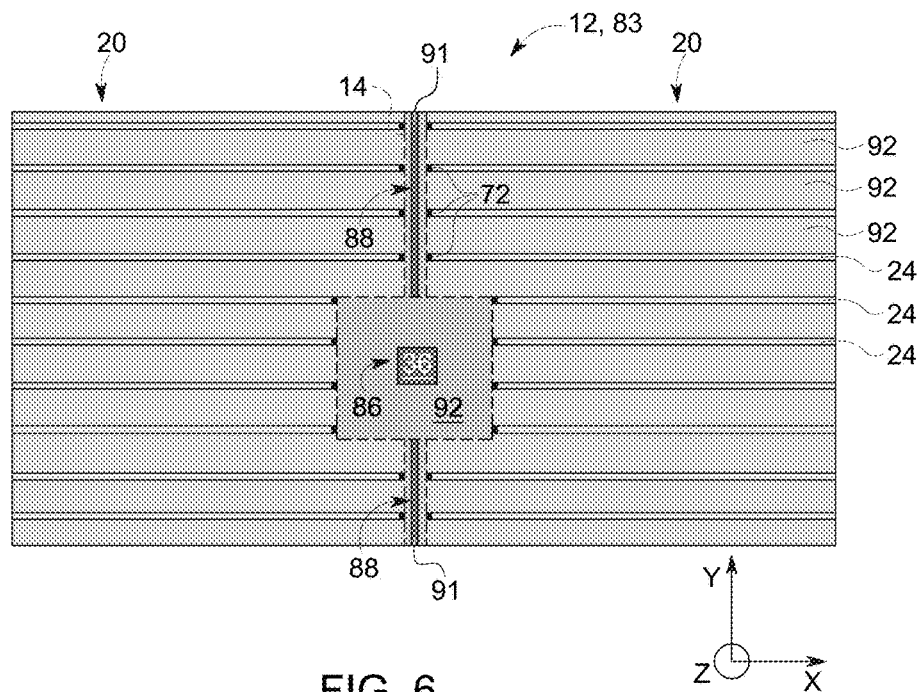
FIG. 6 is a top-down view of the surface of the power conversion device illustrated in FIG. 5, after forming a dielectric layer over the surface of the device, and then selectively etching the surface of the device to form gate and bus vias in the gate pad and bus area, as well as expose body/source contact regions of the plurality of device cells in the active area, in accordance with embodiments of the present approach.

Returning to FIG. 2, the illustrated process 50 continues with forming (block 60) a dielectric layer over a substantial portion of the surface of the power conversion device 12. In certain embodiments, the dielectric layer deposited in block 60 may be referred to as an interlayer dielectric layer (ILD). Subsequently, the surface of the power conversion device 12 may be selectively etched (block 62) to expose the gate metal contact region 36 of the gate pad 16 and gate bus metal contact regions 91 of the gate buses 18 in the gate pad and bus area 14 of the device, and to expose the body/source contact regions 24 of the device cells 22 in the active area 20 of the device 12. For example, FIG. 6 illustrates an example of the surface 83 of the power conversion device 12 after performing the steps set forth in blocks 60 and 62. The surface 83 of the device 12, as illustrated in FIG. 6, includes an ILD 92 disposed over a substantial portion of the surface of the device 12 (e.g., the gate electrodes 34, the gate buses 18, the gate pad 16). Further, in FIG. 6, portions of the dielectric (e.g., the gate dielectric layer 70) have been selectively removed to expose the body/source contact regions 24 of the device cells 22 in the active area 20 of the device 12 for later source metallization. Additionally, portions of the ILD 92 have been etched to form a gate via 86 that exposes the gate metal contact region 36 of the gate pad 16, and to form a bus vias 88 that expose gate bus metal contact regions 91 of the gate buses 18, in the gate pad and bus area 14 of the device 12 for later metallization.

Figure 7:
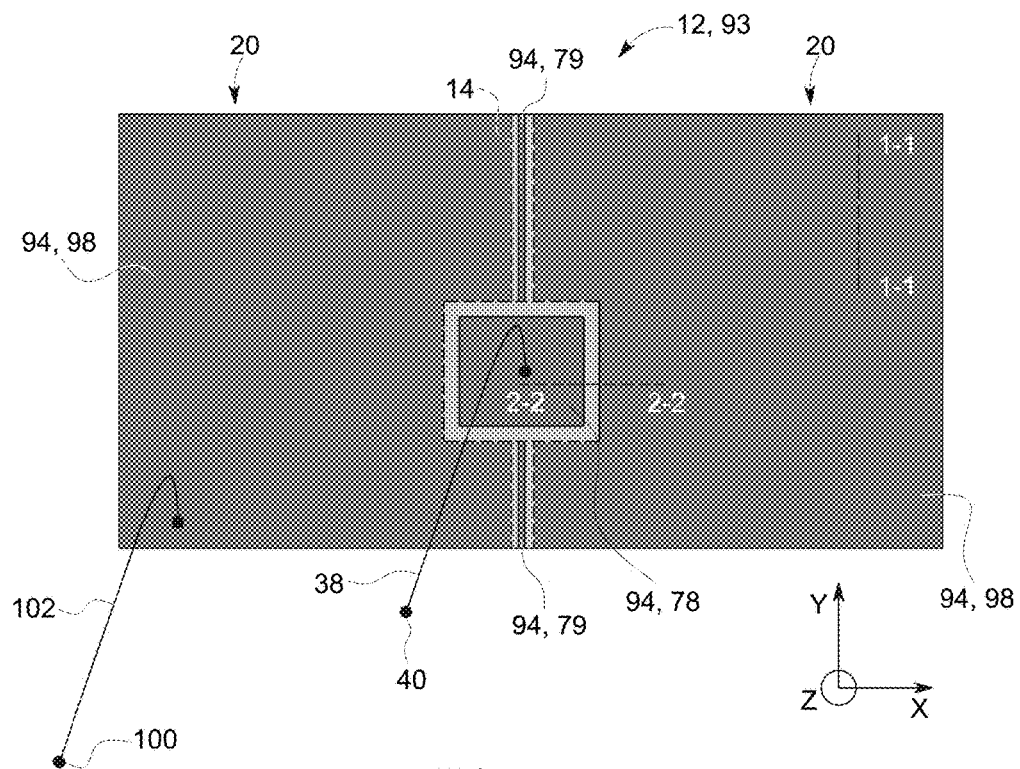
FIG. 7 is a top-down view of the surface of the power conversion device illustrated in FIG. 6, after depositing gate pad metal and gate bus metal in the gate pad and bus area of the device, and after depositing source metal in the active area of the device, in accordance with embodiments of the present approach.

Returning to FIG. 2, the illustrated process 50 concludes with depositing (block 64) source metal over the body/source contact regions 24 of the plurality of striped device cells 22 in the active area, and depositing gate pad metal 78 directly over the gate metal contact region 38 of the gate pad 16, as well as depositing gate bus metal 79 over the gate bus metal contact region 91, in the gate pad and bus area 14 of the of the power conversion device 12. For example, in certain embodiments, one or more metals (e.g., aluminum) may be deposited (e.g., evaporated, sputtered, deposited by chemical vapor deposition) over a substantial portion of the surface 83 of the device 12 illustrated in FIG. 6, such that the portions of the surface 83 of the device 12 exposed in block 62 are directly contacted by the deposited metal. Subsequently, as illustrated by the surface 93 of the device 12 in FIG. 7, the deposited metal layer 94 is selectively etched to form and electrically isolate gate pad metal 78 disposed in the gate pad and bus area 14 of the device 12 from source metal 98 disposed in the active area 20 of the device 12. Additionally, the deposited metal layer 94 is selectively etched to electrically isolate gate pad metal 78 disposed over the gate pad 16 from gate bus metal 79 disposed over the gate bus 18. It may be appreciated that the gate bus metal 79 reduces impedance of the gate bus 18. As illustrated in FIG. 7, the gate pad metal 78 is electrically coupled to an external gate connection 40 via the wire bond 38, and the source metal 98 is electrically coupled to an external source connection 100 via the wire bond 102, to facilitate operation of the power conversion device 12.

Figure 8A:
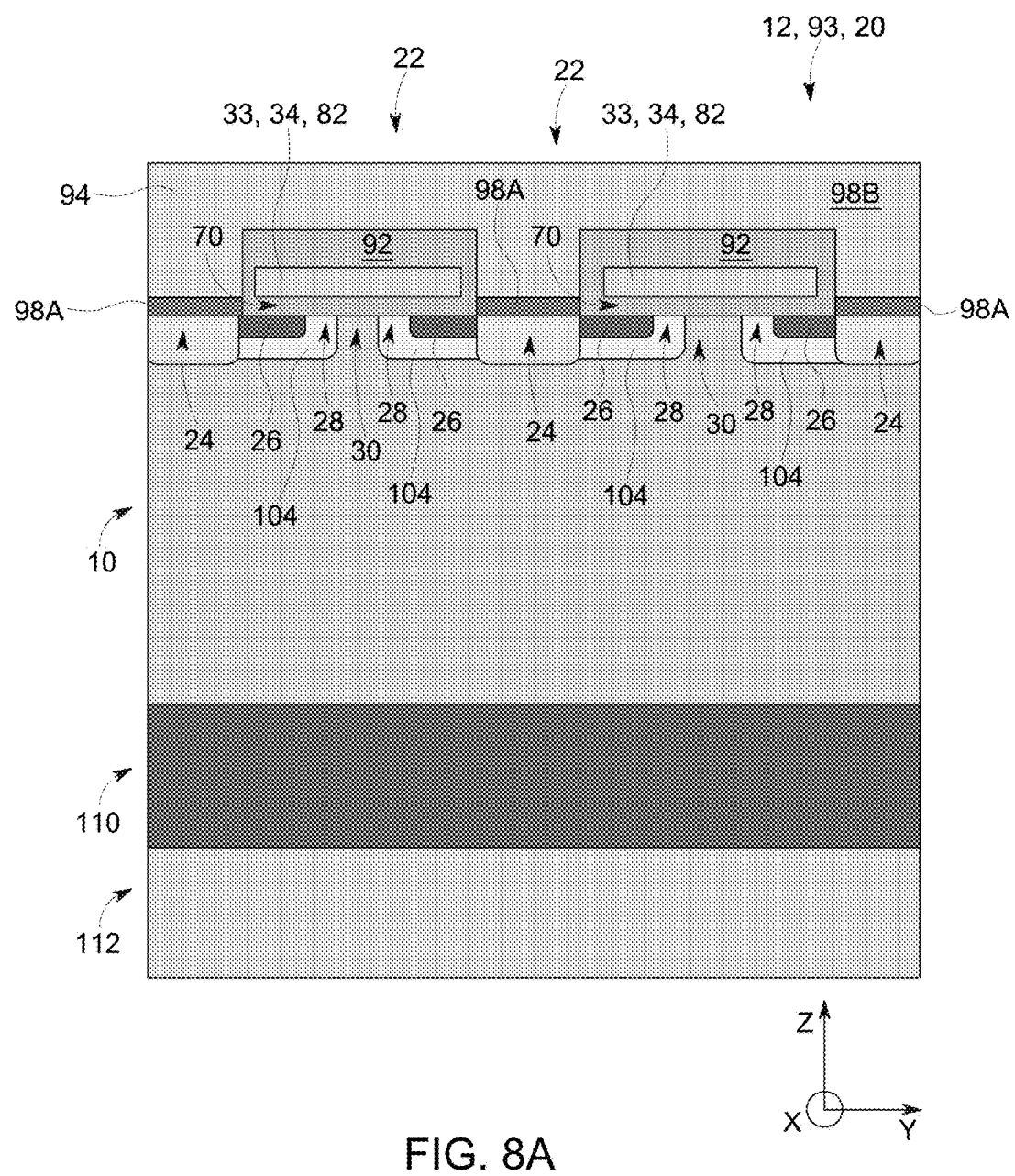
FIGS. 8A and 8B are cross-sectional views of the power conversion device illustrated in FIG. 7, taken along lines 1-1 and 2-2, respectively, in accordance with embodiments of the present approach.

FIG. 8A illustrates a cross-sectional view of the embodiment of the power conversion device 12, as illustrated in FIG. 7, taken along the line 1-1. More specifically, the cross-sectional view of the device 12 in FIG. 8A illustrates a plurality of device cells 22 including body/source contact regions 24, source regions 26, channel regions 28 (part of well regions 104), and JFET regions 30, as set forth above. Additionally, the illustrated device 12 includes gate electrodes 34 that are separated from portions of the source regions 26, channel regions 28, and JFET regions 30 by the gate dielectric layer 70, and separated from the source metal 98 by the ILD 92. The illustrated source metal 98 includes a first portion 98A (e.g., a contact portion 98A) that is directly over the body/source contact regions 24, and a second portion 98B disposed directly over the first portion 98A. FIG. 8A further illustrates that the semiconductor layer 10 is disposed above (e.g., directly on) a substrate layer 110. The illustrated device 12 also includes drain metal 112 deposited on a surface of the substrate layer 110, opposite the semiconductor layer 10. It should be noted that there exists a capacitance associated with the gate electrode 34 coupled to the source metal 98 through the ILD 92 and the underlying semiconductor regions through the gate dielectric 70, and this acts as a capacitive load that is charged and discharged during switching transients.

Figure 8B:
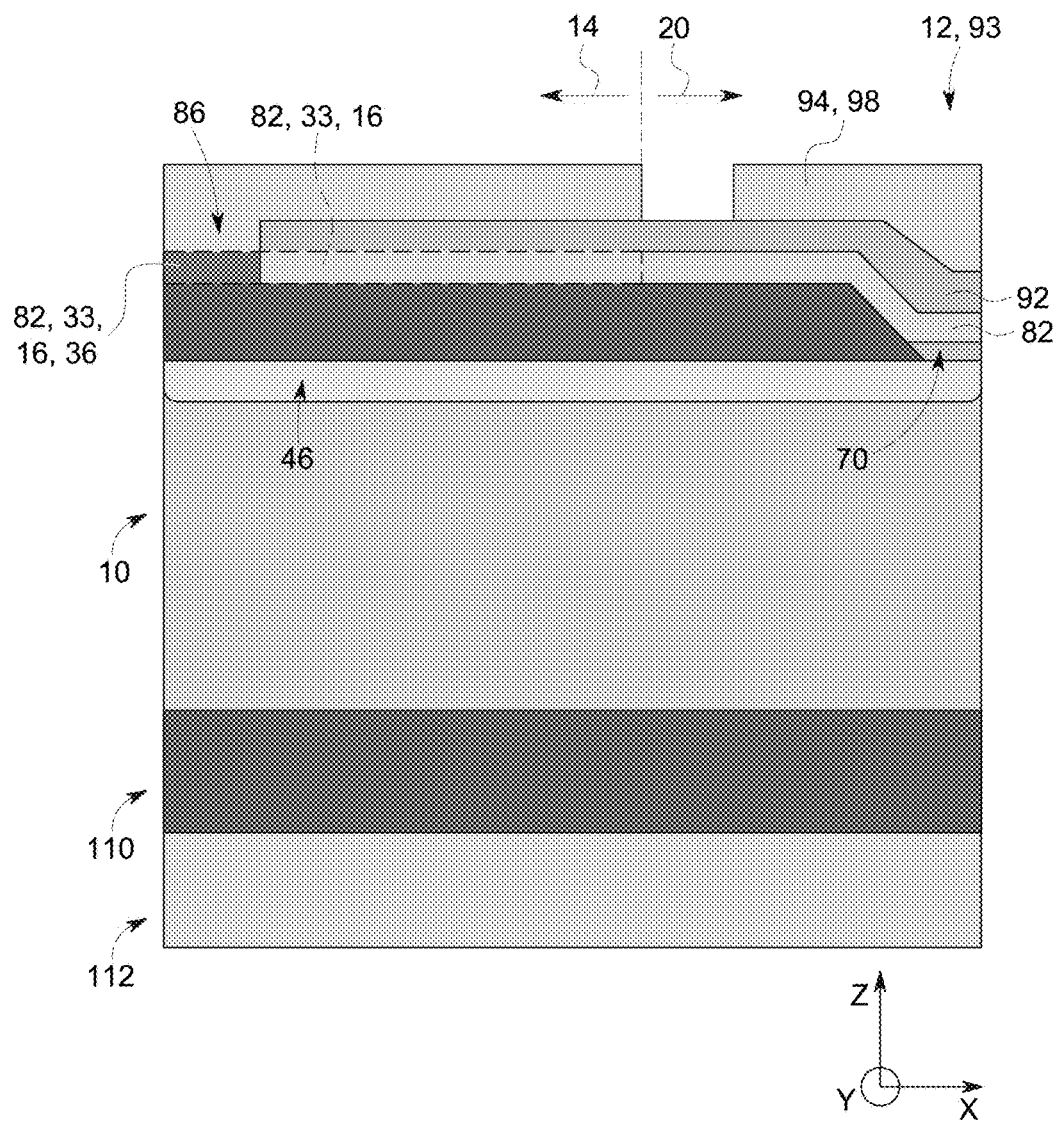

FIG. 8B illustrates another cross-sectional view of the embodiment of the power conversion device 12 of FIG. 7, instead taken along the line 2-2. More specifically, the cross-sectional view of FIG. 8B illustrates a portion of a boundary between the active area 20 and the gate pad and bus area 14 of the device. As such, FIG. 8B illustrates a gate electrode 34 of a device cell 22 (not shown) extending from the active area 20 and being electrically and physically connected to the gate pad 16, all formed from the same gate material 82, which has a PTC (e.g., greater than approximately 2000 ppm/° C.). Additionally, gate via 86 provides an opening in the ILD 92 that enables the gate pad metal 78 to directly contact the gate metal contact region 36 of the gate pad 16. As such, the transient gate current (or gate charge) flow path for the illustrated gate network 33 includes the gate pad metal 78, the gate pad 16, and gate electrode 34. It may be noted that, in certain embodiments device 12, numerous (e.g., tens or hundreds) of MOSFET cells 22 may have gate electrodes 34 that are electrically connected directly to the gate pad 16, as illustrated in FIG. 8B.

As set forth above, it is presently recognized that, for SiC power conversion devices, voltage overshoots can become more pronounced with decreasing $R_g$ and with increasing junction temperature ($T_j$), which undesirably increases switching losses, and stresses the power conversion device and other system components, which can lead to early destructive failure. As set forth above, the gate network 33 has a PTC and is, therefore, designed to provide a resistance that suitably varies with $T_j$ to ensure that device cell peak voltage remains below a predetermined maximum voltage value (i.e., $V_{max}$) across the range of the expected operating junction temperatures of the device. As an example, from a predetermined $T_{low}$ (e.g., 20° C., 25° C., 80° C.) to a predetermined $T_{high}$ (e.g., 150° C., 175° C.), based on temperatures observed during normal (e.g., rated) operation of the power conversion device 12, as discussed below. Additionally, since the gate material 82 of the gate network 33 decreases in resistance with decreasing junction temperature, this enables the gate network 33 to substantial decrease switching losses in the device 12 when the junction temperature is below a maximum operational junction temperature (i.e., when $T_j<T_{high}$), as discussed below. As discussed below, the PTC behavior of the gate network 33 provides a feedback mechanism to increase the gate resistance at high junction temperatures, with a corresponding decrease of voltage overshoot and ringing associated with power conversion device turn off and diode turn off, at the expense of increased losses at higher junction temperatures.

Figure 9A:
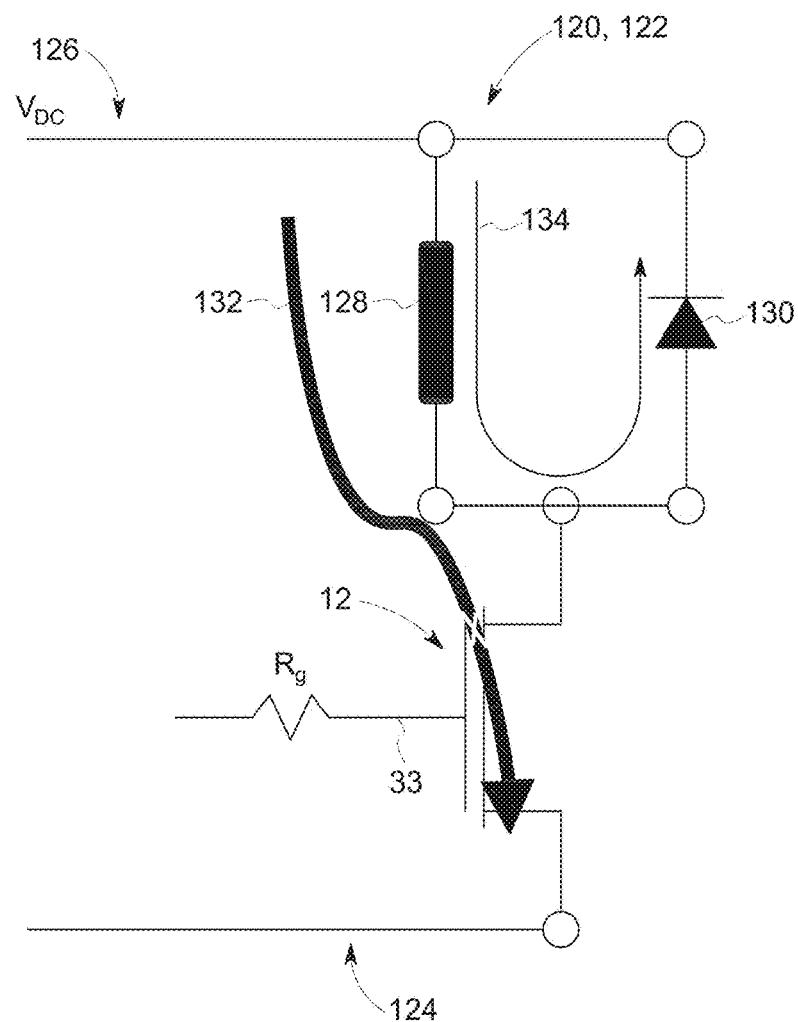
FIG. 9A is a diagram of a portion of a circuit of a power conversion module that includes a diode and a power conversion device (i.e., a SiC MOSFET power conversion device) with a gate network having a PTC, wherein the power conversion device is being turned off, in accordance with embodiments of the present approach.
Figure 9B:
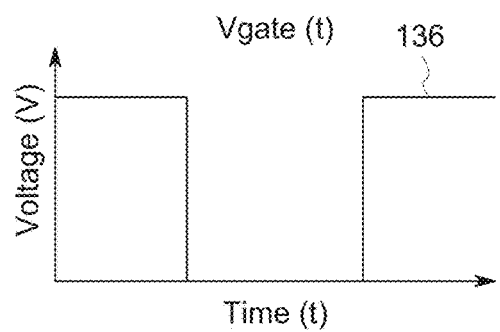
FIG. 9B is a plot of gate voltage versus time corresponding to the turn-off of the power conversion device of the circuit illustrated in FIG. 9A, in accordance with embodiments of the present approach.

FIG. 9A illustrates a portion of a circuit 120 of a power module 122. As used herein, "power conversion system" refers to a system designed to convert electrical power from one form to another (e.g., DC-to-AC, AC-to-DC, DC-to-DC) using one or more power modules. As used herein, a "power module" refers to a subsystem of a power conversion system that includes multiple power conversion devices (e.g., SiC MOSFET power conversion device 12), as well as supporting components (e.g., diodes, inductors, capacitors, resistors, etc.) to facilitate their operation. The illustrated circuit 120 includes an embodiment a power conversion device 12 (i.e., a SiC MOSFET power conversion device 12) having a gate network 33 with a PTC, which enables a particular (constant) $R_g$ when operated at a particular (constant) temperature. In the illustrated circuit 120, the power conversion device 12 is electrically connected directly to a first $V_{DC}$ leg 124 of the circuit 120, and is electrically connected to the opposite $V_{DC}$ leg 126 of the circuit 120 via an inductor 128 and a diode 130 that are electrically connected in parallel to one another. As indicated by the gate voltage signal curve 136 in FIG. 9B, the circuit 120 illustrated in FIG. 9A is associated with the turn-off of the power conversion device 12 and the corresponding turn-on of the diode 130. Accordingly, FIG. 9A includes arrow 132, representing an initial current, and includes arrow 134, representing a load current, associated with the turn-off of the power conversion device 12 in the illustrated circuit 120.

Figure 10A:
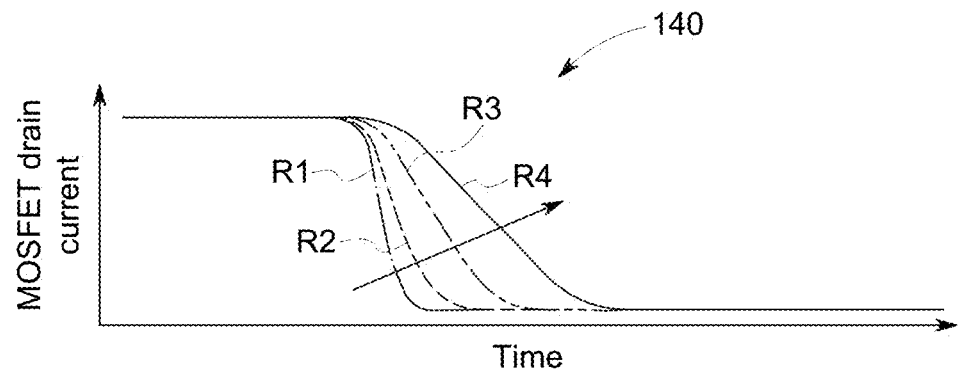
FIGS. 10A and 10B are graphs illustrating MOSFET turn-off waveforms for embodiments of the circuit illustrated in FIG. 9A with power conversion devices having different gate networks that enable different total equivalent series gate resistances ($R_g$) at a particular (constant) temperature, in accordance with embodiments of the present approach.
Figure 10B:
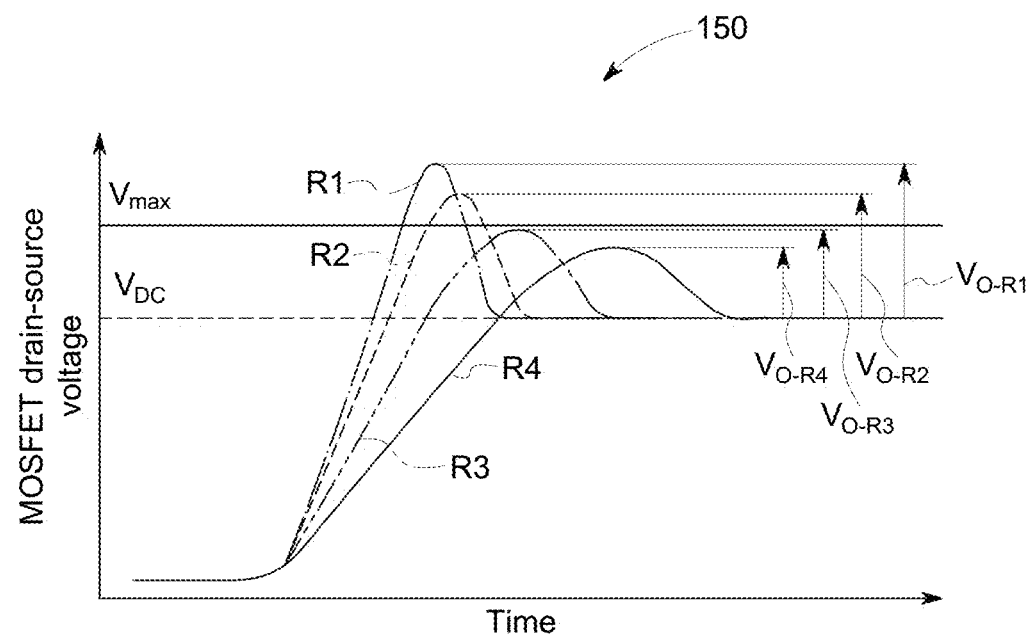

FIGS. 10A and 10B are graphs illustrating MOSFET turn-off waveforms for embodiments of the circuit 120 illustrated in FIG. 9A with power conversion devices 12 having different gate networks 33 that enable different total equivalent series gate resistances ($R_g$) at a particular (constant) temperature. More specifically, FIG. 10A is graph 140 illustrating drain current of the power conversion device 12 versus time for four embodiments of the circuit 120 that respectively include a power conversion device 12 having a particular gate network 33 that enables a particular $R_g$ (i.e., R1<R2<R3<R4). FIG. 10B is a graph 150 illustrating drain-source voltage of the power conversion device 12 versus time for the same four embodiments of the circuit 120 represented in FIG. 10A, indicating voltage overshoots ($V_{O-R1}$, $V_{O-R2}$, $V_{O-R3}$, $V_{O-R4}$) that result from increasing $R_g$ values R1, R2, R3 and R4.

For the embodiments of the circuit 120 represented in FIGS. 10A and 10B, as $R_g$ increases, the turn-off transient of the power conversion device 12 slows (e.g., slower rate of change in turn-off current over time, smaller di/dt). Additionally, since turn-off energy loss ($E_{off}$) of the power conversion device 12 is provided by the integral of $I_D(t) \times V_{DS}(t)$ over the transient time, $E_{off}$ increases with increasing $R_g$. As $R_g$ decreases, the turn-off transient speeds up (e.g., faster change in turn-off current of the power conversion device 12 over time, larger di/dt). Additionally, since voltage overshoots are substantially due to the product of the parasitic inductance of the current commutation loop ($L_{parasitic}$) and the turn-off transient (i.e., $L_{parasitic} \times di/dt$), voltage overshoots also increase with decreasing $R_g$. As such, for present embodiments, the disclosed gate network 33 is designed to have a resistivity to enable a $R_g$ that maintains peak voltages below $V_{max}$ while minimizing $E_{off}$. For example, of the $R_g$ values represented in FIGS. 10A and 10B, the $R_g$ value indicated by R3 maintains peak voltages below $V_{max}$ while minimizing $E_{off}$ for the turn-off transient of the power conversion device 12 in the circuit 120 of FIG. 9A.

Figure 11A:
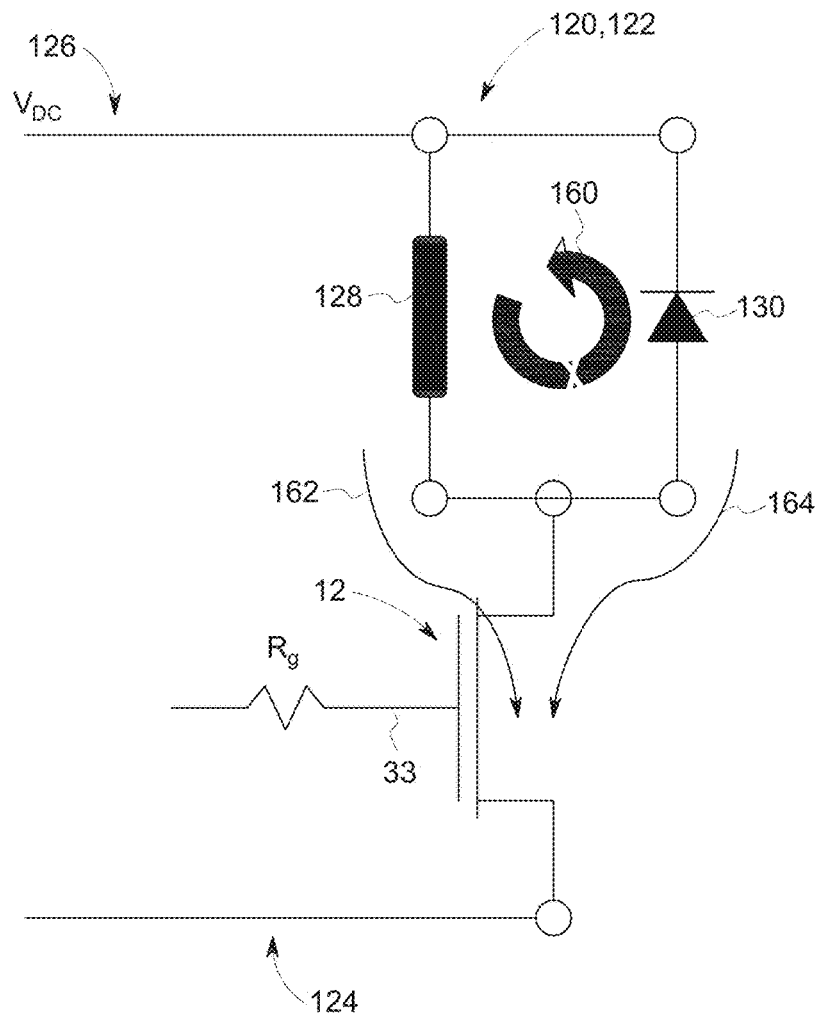
FIG. 11A is a diagram of the portion of a circuit of 9A, wherein the power conversion device is being turned on, in accordance with embodiments of the present approach.
Figure 11B:
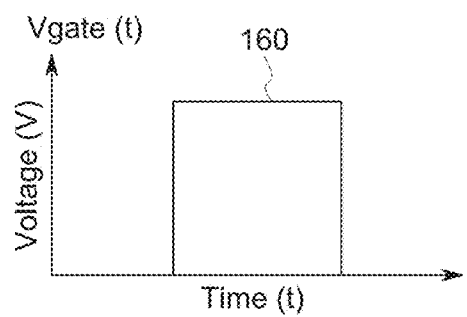
FIG. 11B is a plot of gate voltage versus time for the turn-on of the power conversion device of the circuit illustrated in FIG. 9A, in accordance with embodiments of the present approach.
Figure 12A:
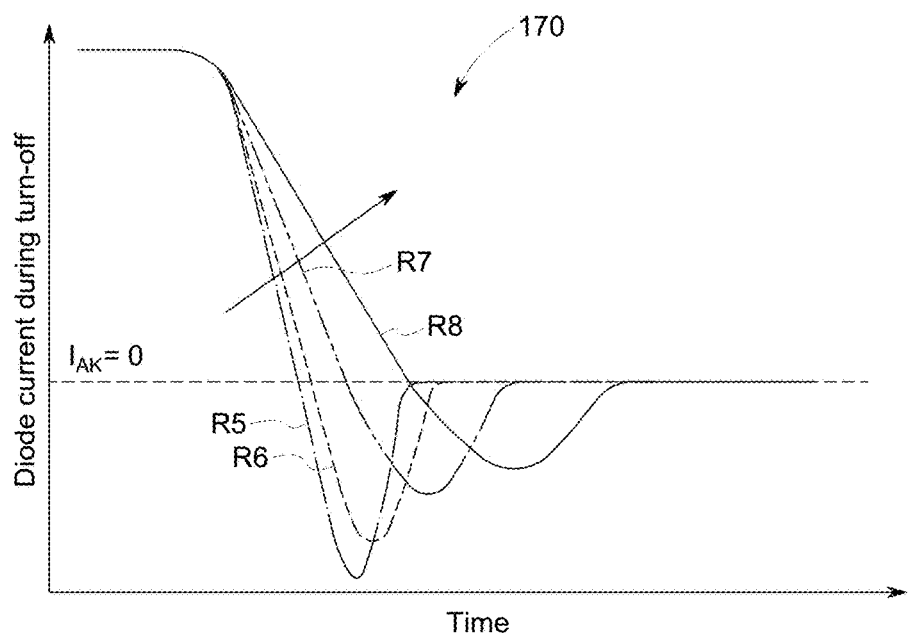
FIGS. 12A and 12B are graphs illustrating diode turn-off waveforms for embodiments of the circuit illustrated in FIG. 11A with power conversion devices having different gate networks that enable different total equivalent series gate resistances ($R_g$) at a particular (constant) temperature, in accordance with embodiments of the present approach.
Figure 12B:
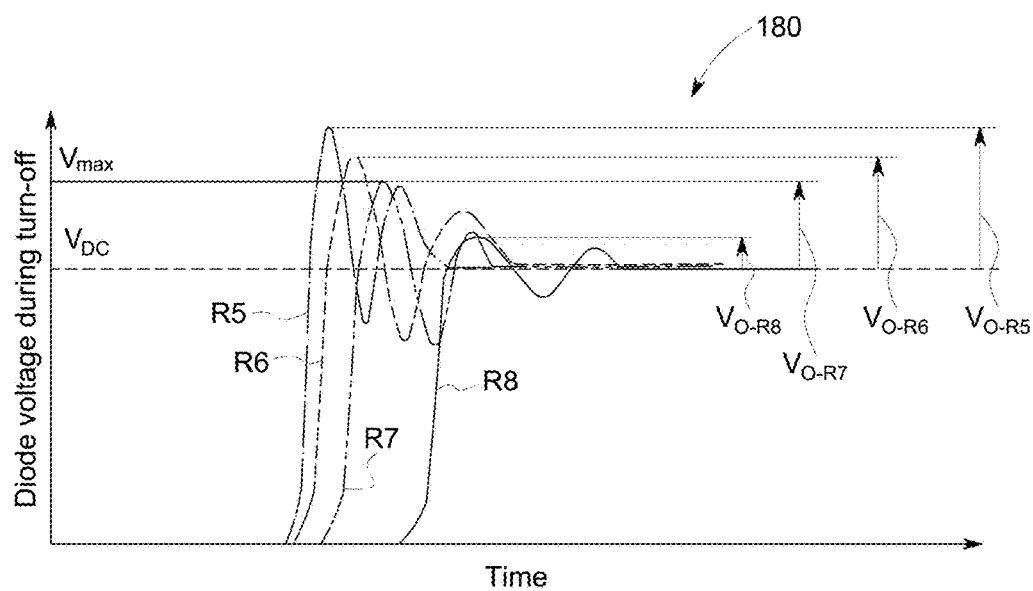

FIG. 11A is the portion of the circuit 120 illustrated in FIG. 9A, wherein, as indicated by the curve 160 of the voltage plot in FIG. 11B, the circuit 120 of FIG. 11A is associated with the turn-off of the diode 128 and the corresponding turn-on of the device cell 22. In addition to the elements discussed above, the circuit 120 illustrated in FIG. 11A includes arrow 160 indicating an initial current, an arrow 162 indicating a load current, and arrow 164 indicating a diode recovery current, through the circuit 120 as the device cell 22 turns on and the diode 130 turns off. FIGS. 12A and 12B are diode turn-on waveforms for different embodiments of the circuit 120 of FIG. 11A including device cells 22 having different $R_g$ as a result of having the disclosed gate network 33 with a higher or lower resistivity at a particular (constant) temperature.

More specifically, FIG. 12A is graph 170 illustrating a drain current of the diode 130 (of FIG. 11A) versus time for four embodiments of the circuit 120 having power conversion devices 12 with particular $R_g$ (i.e., R5<R6<R7<R8). FIG. 12B is a graph 180 illustrating cathode-anode voltage (or "reverse") of the diode 130 versus time for the same four embodiments of the circuit 120 represented in FIG. 12A, indicating voltage overshoots ($V_{O-R5}$, $V_{O-R6}$, $V_{O-R7}$, $V_{O-R8}$) that result from increasing $R_g$ values R5, R6, R7, and R8. As illustrated, as $R_g$ increases, the turn-on transient of the power conversion device 12 slows (e.g., slower rate of change in turn-off current of the diode 130 over time). As $R_g$ decreases, the turn-off transient speeds up (e.g., faster change in turn-off current of the diode 130 over time), and voltage overshoots increase due to the parasitic inductance of the current commutation loop ($L_{parasitic}$) according to $L_{parasitic} \times di/dt$. As such, for present embodiments, the range of resistivity of the gate network 33 is generally selected to enable a $R_g$ that maintains peak voltages below $V_{max}$ while minimizing $E_{off}$. For example, of the $R_g$ values represented in FIGS. 12A and 12B, the $R_g$ value indicated by R7 maintains peak voltages in the diode 130 below $V_{max}$ (e.g., a rated voltage of the diode 130) while minimizing $E_{off}$ in the diode 130. It may be generally noted that R1, R2, R3, and R4, represented in FIGS. 10A and 10B, may not be the same as R5, R6, R7, and R8, represented in FIGS. 12A and 12B. In other words, it may be appreciated that the disclosed gate network 33 can be designed to have a particular range of resistivity over a range temperatures between $T_{low}$ and $T_{high}$ to enable a suitable $R_g$ based on both the turn-off waveforms of the device cell 22, as illustrated in FIGS. 10A and 10B, and the turn-off waveforms of the diode 130, as illustrated in FIGS. 12A and 12B.

Figure 13:
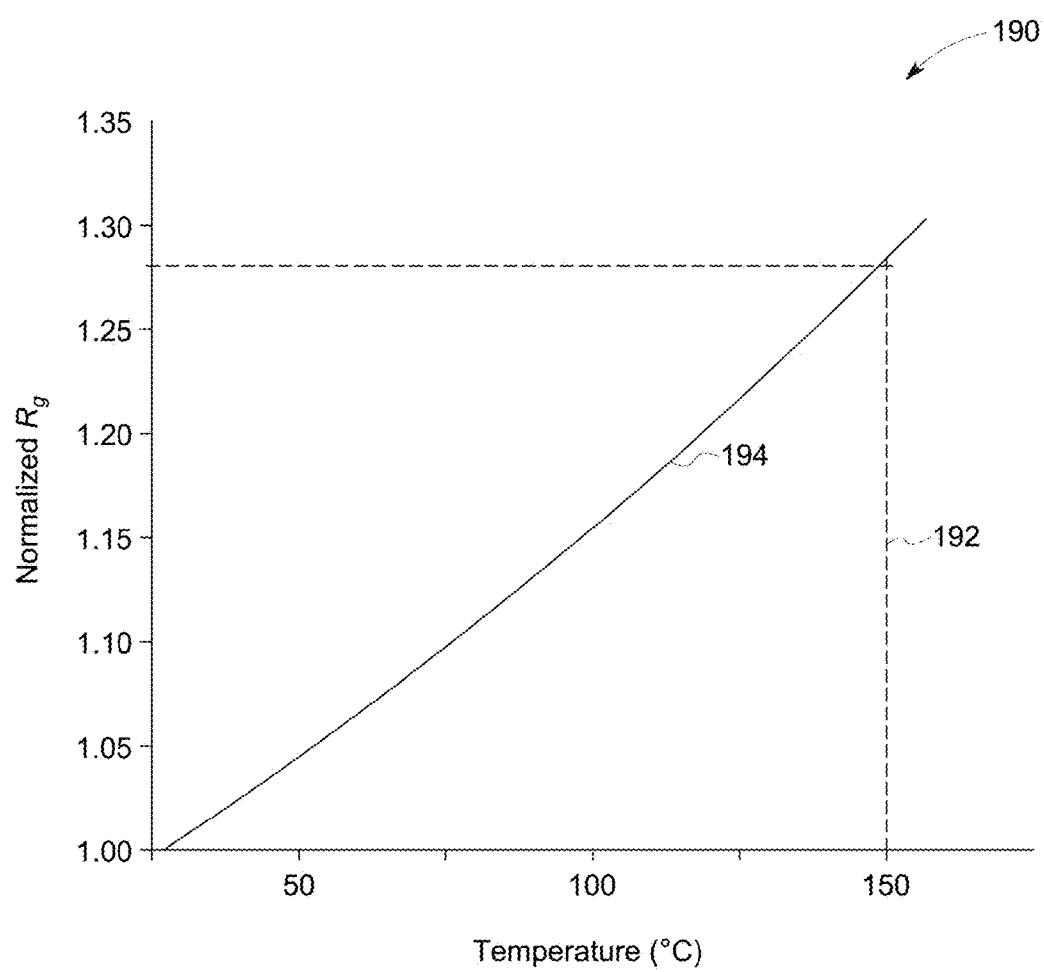
FIG. 13 is a graph illustrating $R_g$ (normalized to $R_g$ at 25° C.) as a function of temperature (° C.) for a power conversion device having a gate network, in accordance with embodiments of the present approach.

FIG. 13 is a graph 190 illustrating normalized $R_g$ (i.e., $R_g/R_g$ at 25° C.) as a function of junction temperature (i.e., $T_j$) in degrees Celsius (° C.), for an embodiment of the power conversion device 12 that includes the disclosed gate network 33. Due to the PTC properties and behavior of the gate network 33, $R_g$ increases with increasing $T_j$ and decreases with decreasing $T_j$ of the power conversion device 12, as indicated by the curve 194. For example, in certain embodiments, as indicated by the curve 194, as $T_j$ increases or decreases within an operational range (e.g., ΔT between a $T_{low}$ of 25° C. and $T_{high}$ of 150° C., as indicated by the dashed box 192), $R_g$ increases or decreases by greater than approximately 25% in response to the temperature change. In certain embodiments, the disclosed gate network 33 of embodiment of the device 12 represented in FIG. 13 enables an increase in $R_g$ of between approximately 25% and approximately 40% (e.g., between approximately 30% and 40%) between $T_{low}$ and $T_{high}$, to reduce switching losses, as disclosed.

For present embodiments, the gate network 33 has a positive temperature coefficient of resistance value (PTC) determined by the structure and materials used to fabricate the components (e.g., the gate pad 16, the gate electrodes 34) of the gate network 33. For example, when the gate network 33 is constructed from a metal silicide/poly Si layer (e.g., $TaSi_2$ on n+ doped polySi), then the relative thicknesses of the metal silicide layer and the poly Si layer impact the PTC value of the gate network 33. For example, in certain embodiments, the gate network 33 has a PTC or PTC value greater than approximately 2000 ppm/° C. In certain embodiments, the PTC or PTC value of the gate network 33 may be greater than approximately 2250 ppm/° C. (e.g., between approximately 2400 ppm/° C. and 3200 ppm/° C.). By comparison, the PTC of a poly-Si resistor can range from a negative value, with conventional doping, to up to several hundreds of ppm/° C., with degenerative doping. As such, it may be appreciated that certain disclosed gate materials 82 (e.g., certain metal silicide/poly-Si layers) offer both lower sheet resistance values and a PTC value that is ten times greater, or more, than that of poly-Si alone.

Figure 14:
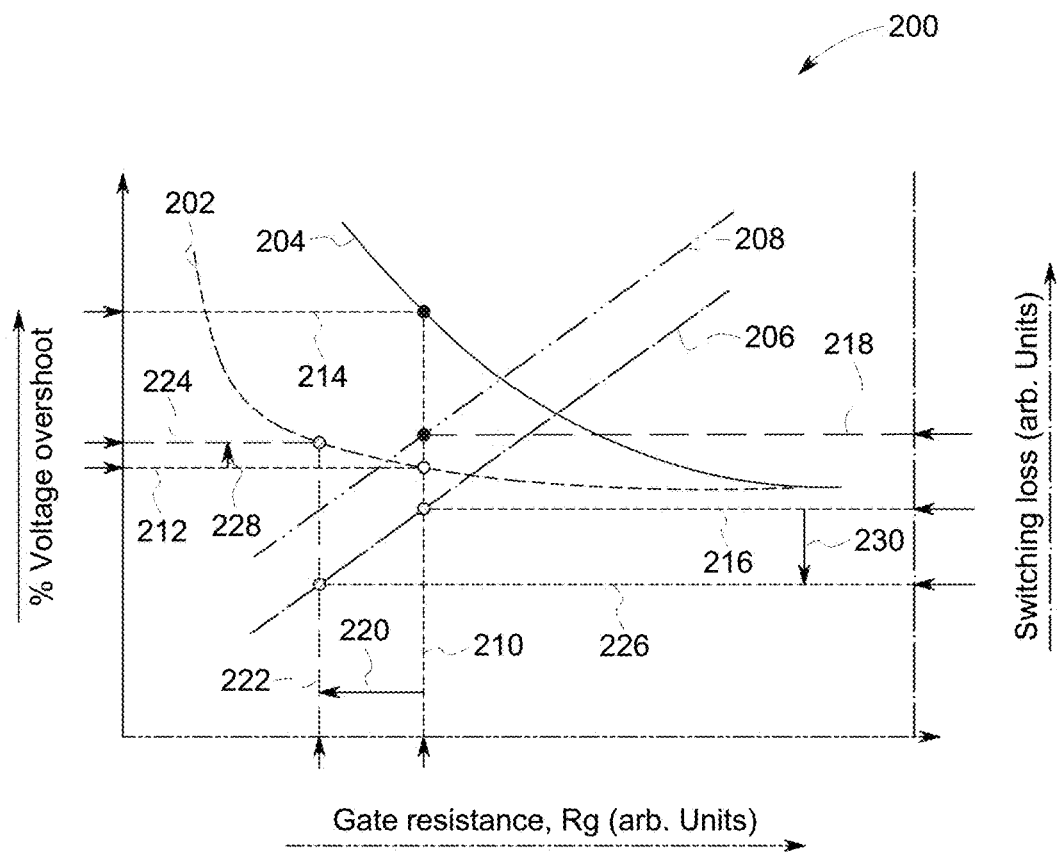
FIG. 14 is a graph indicating both voltage overshoot (%) and switching loss (in arbitrary units), both as a function of $R_g$ (in arbitrary units), in accordance with embodiments of the present approach.

FIG. 14 is a double y-axis x-y graph 200 indicating both voltage overshoot (%) and switching loss (in arbitrary units) as functions of $R_g$ (in arbitrary units) for embodiments of power conversion devices 12 of the present approach. The curve 202 represents the voltage overshoot of a power conversion device 12 at a minimum junction temperature of the operating range, $T_{low}$ (e.g., 25° C.), while the curve 204 represents the voltage overshoot of the device 12 at the maximum junction temperature of the operating range, $T_{high}$ (e.g., 150° C.). Similarly, the curve 206 represents switching loss of the device 12 at the minimum junction temperature ($T_{low}$) of the operating range, while the curve 208 represents the switching losses of the device 12 at the maximum junction temperature of the operating range ($T_{high}$).

With the foregoing in mind, a comparative device (e.g., a power conversion device substantially similar to the power conversion device 12 of FIG. 1, wherein the gate network does not have a PTC) has a substantially constant $R_g$, as indicated by the dashed line 210, whether the junction temperature is at $T_{low}$ or $T_{high}$. As such, for the comparative power conversion device (with constant $R_g$), voltage overshoot at $T_{low}$ is indicated by the dashed line 212, and voltage overshoot at $T_{high}$ is indicated by the dashed line 214 (corresponding to $V_{max}$, a rated maximum voltage of the device). Likewise, for the comparative power conversion device (with constant $R_g$), switching losses at $T_{low}$ are indicated by the dashed line 216, while switching losses at $T_{high}$ are indicated by the dashed line 218.

With this in mind, for embodiments of the present approach, the disclosed gate network 33 enables a variable $R_g$ with a reduction in $R_g$ at junction temperatures below $T_{high}$ (e.g., between $T_{low}$ and $T_{high}$), as indicated by the arrow 220. That is, because the one or more components of the gate network 33 have a PTC, the $R_g$ of the device 12 varies between a minimum $R_g$ at $T_{low}$ (as indicated by the dashed line 222) and a maximum $R_g$ at $T_{high}$ (as indicated by the dashed line 210). It may be noted that, for the comparison represented in FIG. 14, the $R_g$ of the power conversion device 12 of the present approach at $T_{high}$ (as indicated by the dashed line 210) is substantially the same as that of the comparative power conversion device having constant $R_g$. As a result, the voltage overshoot and the switching losses of represented embodiment of the power conversion device 12 at $T_{high}$ are substantially the same as the voltage overshoot and the switching losses of the comparative device 12 at $T_{high}$. In other words, the voltage overshoot at $T_{high}$ indicated by the dashed line 214 and the switching losses at $T_{high}$ indicated by the dashed line 218 are indicative of the voltage overshoot and switching losses for both the power conversion device 12 of the present approach and the comparative device having constant $R_g$ when operating at $T_{high}$. Therefore, as illustrated, both the power conversion device 12 of the present approach and the comparative power conversion device (with constant $R_g$) maintain the voltage overshoot below a max allowable voltage overshoot limit (e.g., below $V_{max}$) at all temperatures between $T_{low}$ and $T_{high}$.

For the embodiment of the presently disclosed power conversion device 12 represented in FIG. 14, voltage overshoot at $T_{low}$ is indicated by the dashed line 224 and the switching losses at $T_{low}$ are indicated by the dashed line 226. For the represented embodiment of the device 12, the reduction in $R_g$ at junction temperatures ($T_j$) below $T_{high}$ results in a slight increase in voltage overshoot (%) relative to the comparative device at $T_{low}$, as indicated by the arrow 228. However, the reduction in $R_g$ when $T_j<T_{high}$ also results in a substantial decrease in switching losses in the device 12 of the present approach relative to the comparative device at $T_{low}$, as indicated by the arrow 230. In other words, it is presently recognized that, with constant $R_g$, for all junction temperatures less than the maximum operating temperature (i.e., when $T_j<T_{high}$), the comparative device would be switching more slowly than actually necessary, resulting in greater switching losses. In contrast, the disclosed gate network 33 enables present embodiments of the power conversion device 12 to switch faster at all junction temperatures less than a maximum operating temperature (i.e., when $T_j<T_{high}$), thereby reducing switching losses. Further, for embodiments the present device 12, as the junction temperature approaches the maximum operating temperature (i.e., as $T_j$ approaches $T_{high}$), the disclosed gate material 82 increases $R_g$ and slows down the switching speed of the power conversion device 12, minimizing voltage overshoots and expanding the safe operating area of the device 12. As such, the disclosed gate network 33 of the device 12 maintains similar performance as the comparative power conversion device when junction temperatures reach $T_{high}$, while demonstrating dramatically improved performance relative to the comparative power conversion device by substantially reducing switching losses at when junction temperatures are less than $T_{high}$.

It should be further noted that, in certain embodiments, the present technique can be combined with techniques disclosed in co-pending U.S. patent application Ser. No. 15/599,119, entitled, "INTEGRATED GATE RESISTORS FOR SEMICONDUCTOR POWER CONVERSION DEVICES," filed May 18, 2017, which is incorporated by reference herein in its entirety for all purposes. To wit, it may be appreciated that, in a typical semiconductor power conversion device, when a suitable voltage pulse is applied to a gate pad, device cells that are closer in proximity to (e.g., have a shorter electrical pathway to) the gate pad may respond (e.g., activate or deactivate, conduct current or block current flow, turn-on or turn-off) faster than device cells that are disposed farther from the gate pad, and the resulting difference in propagation delays can create undesirable localization in the current/voltage distribution of the power conversion device.

With this in mind, in certain embodiments, in addition to the gate network discussed above, a power conversion device may include a gate pad having an integrated resistor network. This integrated resistor network generally provides different resistances (e.g., a least two different resistance values) between the gate metal contact region and gate electrodes of device cells disposed in different areas of the power conversion device. The integrated resistor network includes a plurality of integrated resistors, wherein each integrated resistor is sized to have a respective resistance that suitably adjusts (e.g., decreases) the switching speed of groups of device cells with gate electrodes electrically coupled to the external gate connection via the integrated resistor. As such, the integrated resistor network can ensure that device cells operate in a synchronized manner (e.g., minimal differences in propagation delay), regardless of their location relative to the gate pad, while avoiding the increase of cost, complexity, and size of external chip resistors. Accordingly, it is presently recognized that the presently disclosed gate material enables the manufacture of both an integrated resistor network and components of the disclosed gate network having PTC properties. For example, in certain embodiments, a gate network of a power conversion device may include a gate pad having an integrated resistor network and also include one or more components (e.g., gate electrodes, gas buses, portions of the gate pad) that demonstrate PTC properties.

Figure 15:
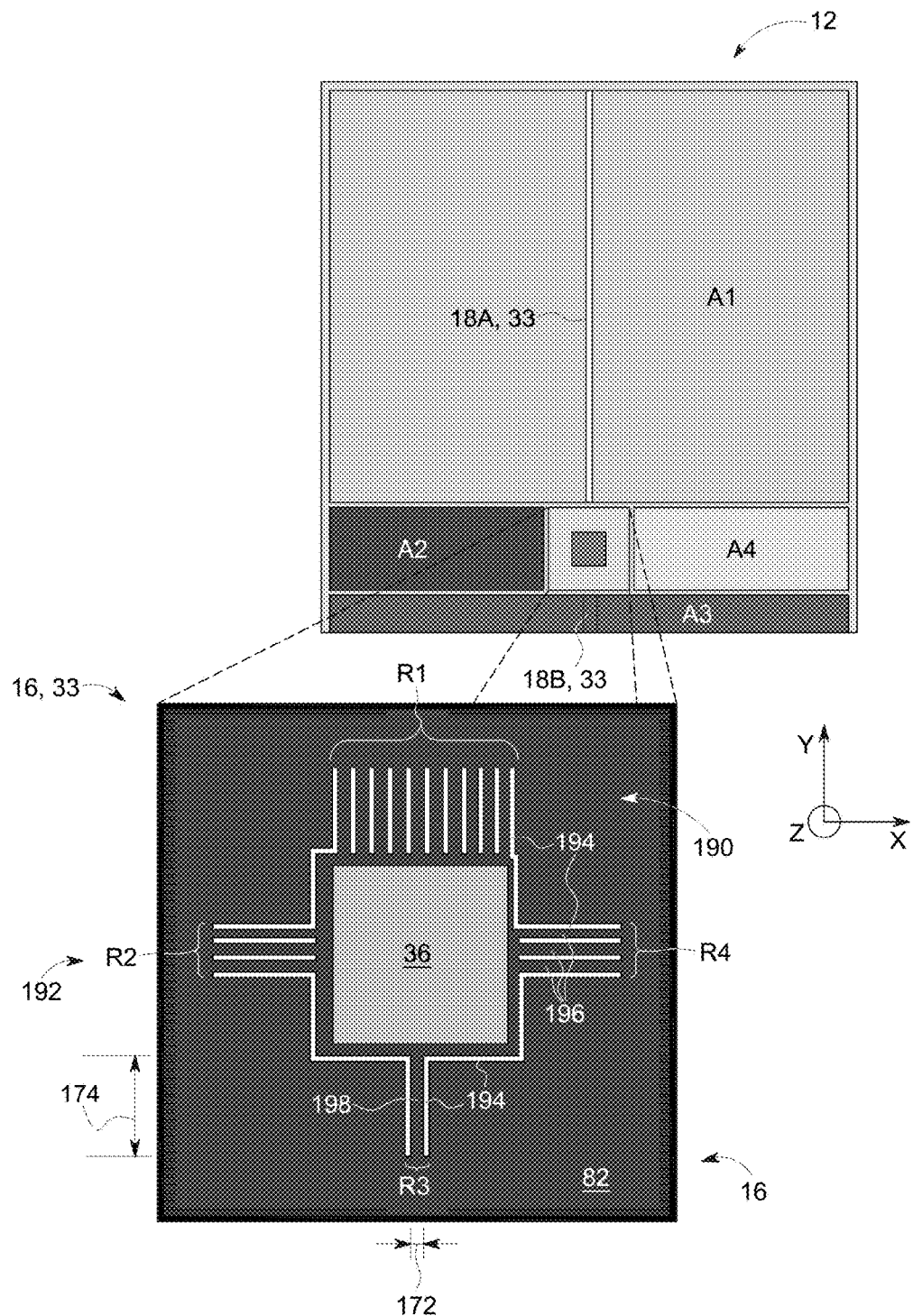
FIG. 15 is a top-down view of a power conversion device with a gate network having a PTC, wherein the gate pad of the gate network also includes an integrated resistor network having multiple integrated resistors with at least two different respective resistance values, in accordance with embodiments of the present approach.

By way of specific example, FIG. 15 is a schematic view of a surface of an embodiment of a power conversion device 12 including device cells with gate electrodes (not illustrated) disposed in areas A1, A2, A3, and A4. For the illustrated embodiment, the gate electrodes of the device cells of area A1 are electrically coupled to the gate pad 16 via the gate bus 18A, the gate electrodes of the device cells of area A3 are electrically coupled to the gate pad 16 via the gate bus 18B, while areas A2 and A4 are directly electrically coupled to the gate pad 16, as discussed above with respect to FIG. 8B. Further, it may be noted that it may be advantageous from a design prospective to have the gate pad 16 off centered (i.e., not disposed in the middle of the surface of the device 12); however, it may also be noted that an off-centered gate pad 16, as illustrated in FIG. 15, demonstrates greater differences propagation delay without the benefit of the disclosed integrated resistor network 190. As such, it should be appreciated that the disclosed integrated resistor network 190 enables greater freedom in the positioning of the gate pad 16 and gate buses 18 while reducing differences propagation delays for device cells 22 the power conversion device 12.

As illustrated in the enlarged portion of FIG. 15, the gate pad 16 of the illustrated embodiment includes an integrated resistor network 190 with multiple integrated resistors 192 (i.e., labeled as integrated resistors R1, R2, R3, and R4) having at least two different respective resistance values. More specifically, when the gate material 82 having a PTC (e.g., greater than approximately 2000 ppm/° C.) is deposited and patterned (e.g., block 56 of FIG. 2), additional portions of the gate material 82 in the gate pad and bus area 14 are removed. These etched portions 194 interrupt continuity of the gate material 82, resulting in a gate pad 16 that includes the integrated resistor network 190 disposed adjacent to the gate metal contact region 36. Each of the integrated resistors R1, R2, R3, and R4 includes or consists of one or more resistor segments 198 (e.g., resistive paths 198) electrically connected in parallel. Additionally, it may also be appreciated that, since the entire gate network 33 is generally made of the gate material 82 having the PTC properties, then portions of the gate pad 16 (e.g., resistor segments 198, remainder of resistor network 190), the gate electrodes, or a combination thereof, may demonstrate PTC properties, in certain embodiments. Accordingly, in certain embodiments, the disclosed gate network 33, including the integrated resistor network 190, enables device cells disposed in different areas of a power conversion device to operate in a synchronized manner, while also reducing switching losses of the device cells operating at relatively lower temperatures ($T_j < T_{high}$) and ensuring that the device cell peak voltage remains below a maximum voltage rating ($V_{max}$).

Technical effects of the present disclosure include the fabrication of semiconductor power conversion devices that include a gate network, in which a gate pad and/or gate electrodes made of a material having a positive temperature coefficient of resistance (PTC, positive TCR). The PTC properties of the disclosed PTC gate material provides a variable total equivalent series gate resistance ($R_g$) over an operational junction temperature range (e.g., between $T_{low}$ of about 25° C. and $T_{high}$ of about 150° C.). As set forth in detail below, the disclosed gate network is in thermal proximity to device cells of the power conversion device and varies in resistivity in response to changes in the junction temperature of nearby device cells. Embodiments of the gate network are designed to have suitable resistivity to ensure that the device cell peak voltage remains below a maximum voltage ($V_{max}$), especially as the junction temperature reaches $T_{high}$, while reducing switching losses of the device cells when the junction temperature is below $T_{high}$. Additionally, in certain embodiments, the power conversion device may additionally have a gate pad including an integrated resistor network with a plurality of integrated resistors that are sized to minimize differences in propagation delay of device cells of the power conversion device regardless of their location relative to the gate pad.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A silicon-carbide (SiC) power conversion device, comprising:
   a gate network, including:
      a plurality of gate electrodes of a respective plurality of SiC metal-oxide-semiconductor-based (MOS-based) transistor device cells disposed in an active area of the SiC power conversion device;
      a gate pad disposed in a gate pad and bus area of the SiC power conversion device;
      a gate bus disposed in the gate pad and bus area of the SiC power conversion device, wherein the gate bus extends between and electrically connects the gate pad to at least a portion of the plurality of gate electrodes in the active area of the SiC power conversion device, wherein at least a portion of the gate pad, the gate bus, the plurality of gate electrodes, or a combination thereof, of the gate network have a positive temperature coefficient of resistance greater than approximately 2000 parts-per-million per degree Celsius (ppm/° C.).

2. The device of claim 1, wherein the positive temperature coefficient of resistance is greater than approximately 2250 ppm/° C.

3. The device of claim 2, wherein the positive temperature coefficient of resistance is between approximately 2400 ppm/° C. and 3200 ppm/° C.

4. The device of claim 1, wherein substantially all of the gate pad, the gate bus, and the plurality of gate electrodes of the gate network have substantially the same positive temperature coefficient of resistance.

5. The device of claim 1, wherein the SiC power conversion device has a total equivalent series gate resistance ($R_g$) operating at a junction temperature ($T_j$) of 150° C. that is at least 25% greater than an $R_g$ of the SiC power conversion device operating at a $T_j$ of 25° C.

6. The device of claim 5, wherein the $R_g$ of the SiC power conversion device operating at the $T_j$ of 150° C. is between approximately 30% and 40% greater than the $R_g$ of the SiC power conversion device operating at the $T_j$ of 25° C.

7. The device of claim 1, wherein the gate network comprises a highly doped polysilicon layer disposed below a metal silicide layer.

8. The device of claim 7, wherein the metal silicide layer comprises molybdenum silicide ($MoSi_2$), tantalum silicide ($TaSi_2$), tungsten silicide ($WSi_2$), cobalt silicide ($CoSi_2$), nickel silicide ($NiSi_2$), titanium silicide ($TiSi_2$), or combinations thereof.

9. The device of claim 1, wherein a sheet resistance of the gate network is between 2 ohms per square (ohm/square) and 50 ohm/square.

10. The device of claim 1, wherein a total equivalent series gate resistance ($R_g$) of the SiC power conversion device is between approximately 1 ohms and approximately 80 ohms.

11. The device of claim 10, wherein the $R_g$ of the SiC power conversion device is between approximately 3 ohms and approximately 20 ohms.

12. The device of claim 1, wherein only the gate pad of the gate network has the positive temperature coefficient of resistance greater than approximately 2000 ppm/° C., and wherein the gate electrodes have substantially lower positive temperature coefficient of resistance.

13. The device of claim 1, wherein only one of the gate pad, the gate bus, and the plurality of gate electrodes has the positive temperature coefficient of resistance.

14. The device of claim 1, wherein the gate pad includes an integrated resistor network having plurality of integrated resistors disposed adjacent to a gate metal contact region, wherein the plurality of SiC MOS-based transistor device cells are disposed in different portions of the active area of the device, wherein a first portion of the plurality of gate electrodes is electrically connected to an external gate connection via a first integrated resistor of the plurality of integrated resistors, the gate bus, and the gate metal contact region, and wherein a second portion of the plurality of gate electrodes in a second portion of the active area of the device is electrically connected to the external gate connection via a second integrated resistor of the plurality of integrated resistors, and the gate contact region, and wherein the first and second integrated resistors have substantially different respective resistance values.

15. The device of claim 1, wherein the plurality of SiC MOS-based transistor device cells are a plurality of metal-oxide-semiconductor field-effect transistor (MOSFET) device cells or a plurality of insulated gate bipolar transistor (IGBT) device cells.

* * * * *